(12) United States Patent
Kaewell, Jr.

(10) Patent No.: US 7,706,833 B2
(45) Date of Patent: Apr. 27, 2010

(54) UNIFIED DUAL-MODE GSM/UMTS CLOCK

(75) Inventor: John David Kaewell, Jr., Jamison, PA (US)

(73) Assignee: InterDigital Technology Corporation, Wilmington, DE (US)

(*) Notice: Subject to any disclaimer, the term of this patent is extended or adjusted under 35 U.S.C. 154(b) by 356 days.

(21) Appl. No.: 11/433,959

(22) Filed: May 15, 2006

(65) Prior Publication Data
US 2006/0276154 A1    Dec. 7, 2006

Related U.S. Application Data

(60) Provisional application No. 60/681,712, filed on May 17, 2005.

(51) Int. Cl.
*H04M 1/00* (2006.01)

(52) U.S. Cl. .................. 455/552.1; 455/553.1; 455/255; 455/260

(58) Field of Classification Search ... 455/552.1–553.1, 455/255, 256, 257, 258–265
See application file for complete search history.

(56) References Cited

U.S. PATENT DOCUMENTS

| | | |
|---|---|---|
| 4,888,748 A | 12/1989 | Lagasse et al. |
| 7,103,343 B2* | 9/2006 | Boos .......................... 455/316 |
| 7,242,912 B2* | 7/2007 | Maligeorgos et al. ......... 455/88 |
| 2001/0055980 A1* | 12/2001 | Sato .......................... 455/552 |
| 2004/0023680 A1 | 2/2004 | Hulvey |
| 2005/0119025 A1* | 6/2005 | Mohindra et al. ........ 455/552.1 |

\* cited by examiner

*Primary Examiner*—Lana N Le
(74) *Attorney, Agent, or Firm*—Volpe and Koenig PC

(57) ABSTRACT

A unified dual-mode global system for mobile communication (GSM)/universal mobile telecommunication systems (UMTS) clock and a transceiver employing the unified GSM/UMTS clock are disclosed. A reference clock generates a reference clock signal and a local oscillator (LO) generates a LO signal based on the reference clock signal. A frequency divider selectively generates either a GSM clock signal or a UMTS clock signal by converting a frequency of the LO signal by a predetermined factor. Both the GSM clock signal and the UMTS clock signal are generated based on the common reference clock signal. The reference clock signal frequency may be a GSM fundamental frequency or a UMTS fundamental frequency. An interpolator and/or a decimator may be used for matching frequencies of UMTS baseband signal and the UMTS clock signal or frequencies of GSM baseband signal and the GSM clock signal.

14 Claims, 2 Drawing Sheets

UNIFIED DUAL-MODE GSM/UMTS CLOCK

CROSS REFERENCE TO RELATED APPLICATION

This application claims the benefit of U.S. provisional application No. 60/681,712 filed May 17, 2005, which is incorporated by reference as if fully set forth.

FIELD OF INVENTION

The present invention is related to modems. More particularly, the present invention is related to a unified dual-mode global system for mobile communication (GSM)/universal mobile telecommunication systems (UMTS) clock and a transceiver employing the unified dual-mode GSM/UMTS clock.

BACKGROUND

In a conventional dual-mode GSM/UMTS modem, two different time bases have been used for clocking, which require multiple clocks and clock generation circuitry. In addition, clock-domain-crossing clock synchronization circuitry must also be constructed on an application specific integrated circuit (ASIC) inside of the dual-mode modem to allow the sharing of information between clock domains. This additional circuitry creates latency in the information transferred, additional power consumption, additional die-area and potential metastability-caused errors.

An alternative to maintaining two simultaneous clocks is to change the operating frequency of a phase locked loop (PLL)/voltage controlled oscillator (VCO) sourcing the clock. However, this would require the modem to re-acquire synchronization when switching between modes.

SUMMARY

The present invention is related to a unified dual-mode GSM/UMTS clock and a transceiver employing the unified dual-mode GSM/UMTS clock. A reference clock generates a reference clock signal and a local oscillator (LO) generates a LO signal based on the reference clock signal. A frequency divider selectively generates either a GSM clock signal or a UMTS clock signal by converting a frequency of the LO signal by a predetermined factor. Both the GSM clock signal and the UMTS clock signal are generated based on the common reference clock signal. The reference clock signal frequency may be a GSM fundamental frequency or a UMTS fundamental frequency, such as 13 MHz, 15.36 MHz, 19.2 MHz, 26 MHz, or 38.4 MHz. An interpolator and/or a decimator may be used for matching frequencies of UMTS baseband signal and the UMTS clock signal, or frequencies, of a GSM baseband signal and the GSM clock signal.

DETAILED DESCRIPTION OF THE PREFERRED EMBODIMENTS

The features of the present invention may be incorporated into an integrated circuit (IC) or be configured in a circuit comprising a multitude of interconnecting components.

Figure 1:
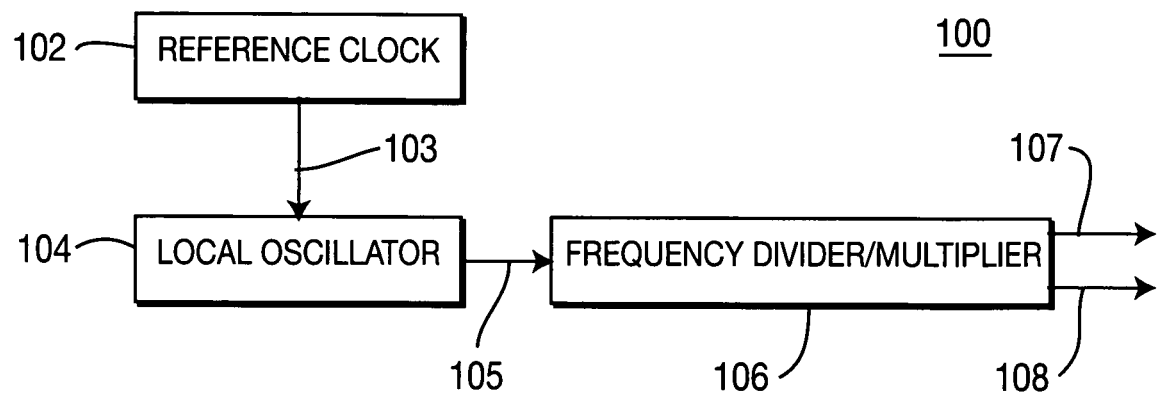
FIG. 1 is a block diagram of a unified dual-mode GSM/UMTS clock configured in accordance with the present invention.

FIG. 1 is a block diagram of a unified dual-mode GSM/UMTS clock 100 configured in accordance with the present invention. The clock 100 includes a reference clock 102, an LO 104 and a frequency divider/multiplier 106. The reference clock 102 generates a reference clock signal 103, which is used as a reference signal by the LO 104 to generate a LO signal 105. The LO signal 105 is then converted to a GSM clock signal 107 or a UMTS clock signal 108 by the frequency divider/multiplier 106.

In accordance with the present invention, both the GSM clock signal 107 and the UMTS clock signal 108 are generated from one common reference clock signal 103. A frequency of the common reference clock signal 103 may be either a GSM fundamental frequency or a UMTS fundamental frequency. For example, the frequency of the reference clock signal 103 may be one of 13 MHz, 15.36 MHz, 19.2 MHz, 26 MHz and 38.4 MHz or an integer multiple or fraction of these frequencies. In accordance with the present invention, the construction of a modem is simplified and additional circuitry needed to facilitate clock domain crossings or resynchronization is eliminated.

Figure 2:
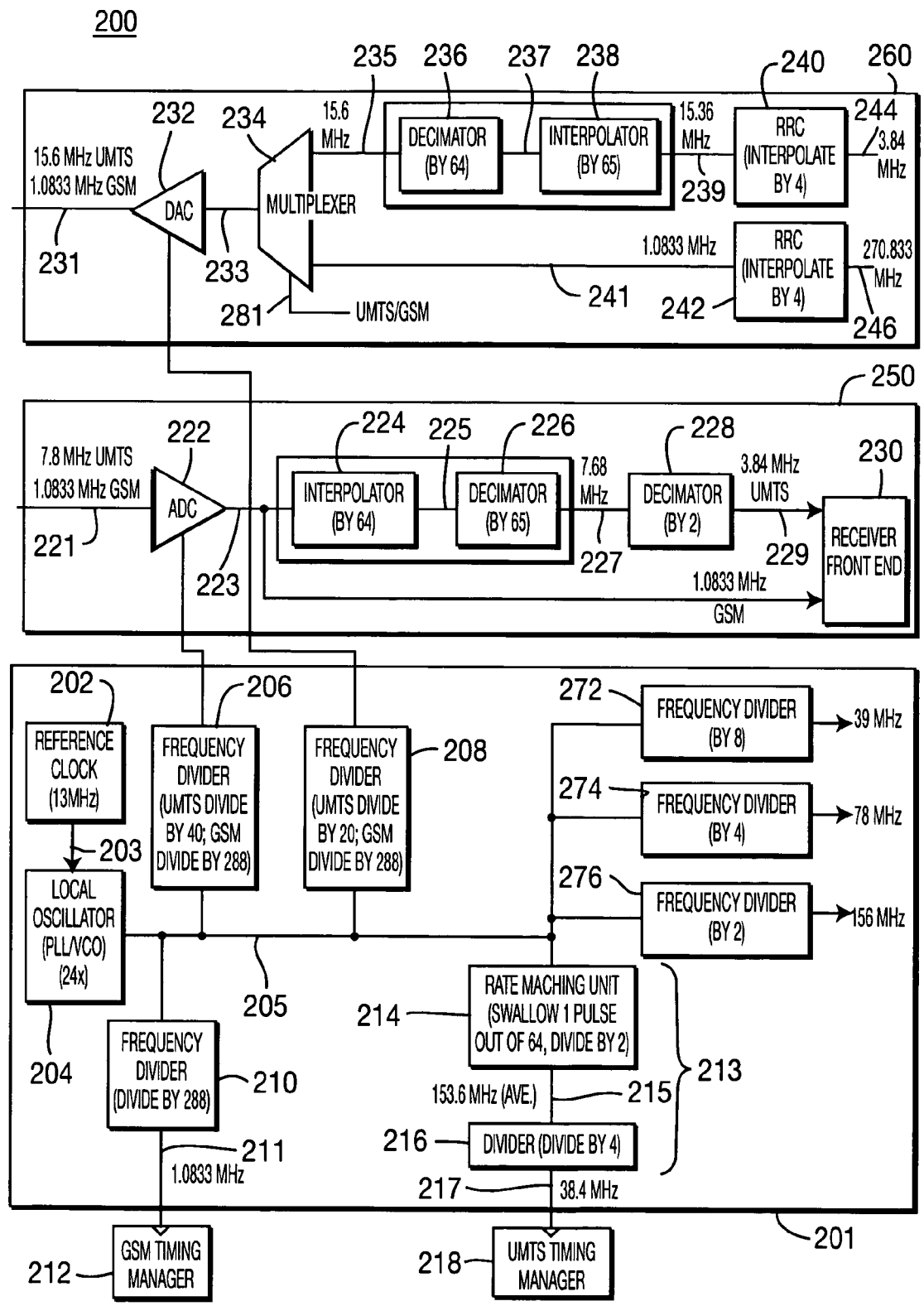
FIG. 2 is a block diagram of an exemplary transceiver employing a unified dual-mode GSM/UMTS clock configured in accordance with the present invention.

FIG. 2 is a block diagram of an exemplary transceiver 200 employing a unified dual-mode GSM/UMTS clock 201 configured in accordance with the present invention. It should be noted that the configuration shown in FIG. 2 is provided as an example, not as a limitation, and any other configuration and numerical values may be used as is obvious to those skilled in the art. The transceiver 200 comprises a transmitter 260, a receiver 250 and a unified dual-mode GSM/UMTS clock 201. The unified dual-mode GSM/UMTS clock 201 includes a reference clock 202, a LO 204, a plurality of frequency dividers. The frequency dividers include a first frequency divider 206 for clocking an ADC in the receiver 250 and a second frequency divider for clocking a DAC in the transmitter 260. The frequency dividers may further include a third frequency divider 210 for a GSM timing manager 212 and a fourth frequency divider 213 for a UMTS timing manager 218. The frequency dividers may further include additional frequency dividers 272, 274 and 276 as required by other processors or modules.

The reference clock 202 generates a reference clock signal 203. The frequency of the reference clock signal 203 may be a GSM fundamental frequency or a UMTS fundamental frequency. FIG. 2 illustrates the case that the frequency of the reference clock signal 203 is a GSM fundamental frequency, (i.e., 13 MHz), and for simplicity the present invention will be explained only with reference to that case. However, it should be noted that the configuration and numerical description of FIG. 2 can be easily modified for the case where a UMTS fundamental frequency, (such as 19.2 MHz), is used as a reference clock signal frequency as it is obvious to those skilled in the art.

The LO 204 is preferably a VCO with a PLL. The LO 204 generates an LO signal 205. In this example, the LO 204 generates the LO signal 205 with a frequency of 24 times the frequency of the reference clock signal 203. Therefore, in this example, the VCO output is 312 MHz. The LO signal 205 is then divided by the frequency dividers to a GSM clock signal, a UMTS clock signal, or any other clock signal.

The first frequency divider 206 and the second frequency divider 208 divide the LO signal 205 to either the GSM clock signal or the UMTS clock signal selectively in accordance with a control signal (not shown), respectively. For example, the first frequency divider 206 divides the LO signal 205 (312 MHz) by a factor of 40 for a UMTS clock signal, so that it generates an output at 7.8 MHz, and by a factor of 288 for a GSM clock signal so that it generates an output at 1.0833 MHz. The second frequency divider 208 divides the LO signal 205 (312 MHz) by a factor of 20 for a UMTS clock signal so that it generates an output at 15.6 MHz, and by a factor of 288 for a GSM clock signal so that it generates an output at 1.0833 MHz. The UMTS clock signals and the GSM clock signals then drive an analog-to-digital converter (ADC) 222 in the receiver 250 and a digital-to-analog converter (DAC) 232 in the transmitter 260 for receive and transmit processing, respectively.

The receiver 250 comprises an ADC 222, an interpolator 224, a decimator 226, a decimator 228 and a receiver front end 230. A down-converted received signal 221 is digitized by the ADC 222 which is clocked by the UMTS clock signal or the GSM clock signal generated by the first frequency divider 206. For example, for the UMTS data, the received signal 221 is digitized with a sampling frequency of 7.8 MHz and the samples 223 are interpolated and decimated by the interpolator 224 and the decimator 226. The interpolator 224 interpolates the samples 223 by a factor of 64 and the decimator 226 decimates the interpolated data 225 by a factor of 65, which results in a down-converted data 227 at 7.68 MHz. The decimator 228 then decimates the down-converted data 227 by a factor of two (2) to further down-convert to 3.84 MHz, which is then forwarded to the receiver front end 230 for further processing. For GSM data, the received data 221 is digitized with a sampling frequency of 1.0833 MHz and the samples 223 are sent to the receiver front end 230 for further processing. It should be noted that the sampling frequencies of 7.8 MHz or 1.0833 MHz are provided as an example and any other sampling frequency or rate and the interpolation and decimation factors may be used as it is obvious to those skilled in the art.

The transmitter 260 comprises root raised cosine (RRC) filters 240, 242, an interpolator 238, a decimator 236, a multiplexer 234 and a DAC 232. UMTS data 244 (3.84 MHz) is preferably up-converted to 15.6 MHz, and GSM data 246 (270.833 KHz) is preferably up-converted to 1.0833 MHz. The UMTS data 244 is processed by the RRC filter 240 which also performs an interpolation. The interpolation, for example, may be by a factor of four (4), which up-converts the UMTS data 244 at 3.84 MHz to 15.36 MHz. The up-converted data 239 by the RRC filter 240 is then processed by the interpolator 238 and the decimator 236 to match the frequencies. Since the second frequency divider 208 generates a UMTS clock signal at 15.6 MHz from the common reference clock signal 203 of 13 MHz to clock the DAC 232 at 15.6 MHz, it is preferable to convert the data rate, (i.e., 15.36 MHz), to this rate, (i.e., 15.6 MHz). The interpolator 238 interpolates the data 239 by a factor of 65 and the decimator 236 decimates the interpolated data 237 by a factor of 64, which generates a data output 235 at 15.6 MHz (=15.36× 65/64).

The GSM baseband data 246 is also processed by the RRC filter 242 which also performs interpolation. The interpolation, for example, may be by a factor of four (4), which up-converts the GSM data 246 at 270.833 KHz to 10.833 MHz.

The up-converted UMTS data 235 and the up-converted GSM data 241 are multiplexed by a multiplexer 234 in accordance with a control signal 281 (UMTS/GSM). The multiplexer 234 selectively outputs one of the inputs 235, 241 in accordance with the control signal 281. The output of the multiplexer is then converted to an analog data by the DAC 232.

The clock 201 may include a third frequency divider 210 to generate a clock signal for clocking a GSM timing manager 212. In the example shown in FIG. 2, the third frequency divider divides the LO signal 205 (312 MHz) by a factor of 288, which down-converts the LO signal 205 to 1.0833 MHz. The down-converted signal 211 then clocks the GSM timing manager 212.

The clock 201 may also include a fourth frequency divider 213 to generate a clock signal for clocking a UMTS timing manager 218. For example, the fourth frequency divider 213 may include a rate matching unit 214 and a divider 216. The rate matching unit 214 swallows one (1) pulse out of 64 pulses of the LO signal 205 and divides it by a factor of two (2) to generate an output at average 153.6 MHz. The divider 216 then divides the output 215 of the rate matching unit 214 by a factor of four (4) to generate a signal 217 at 38.4 MHz.

Figure 3:
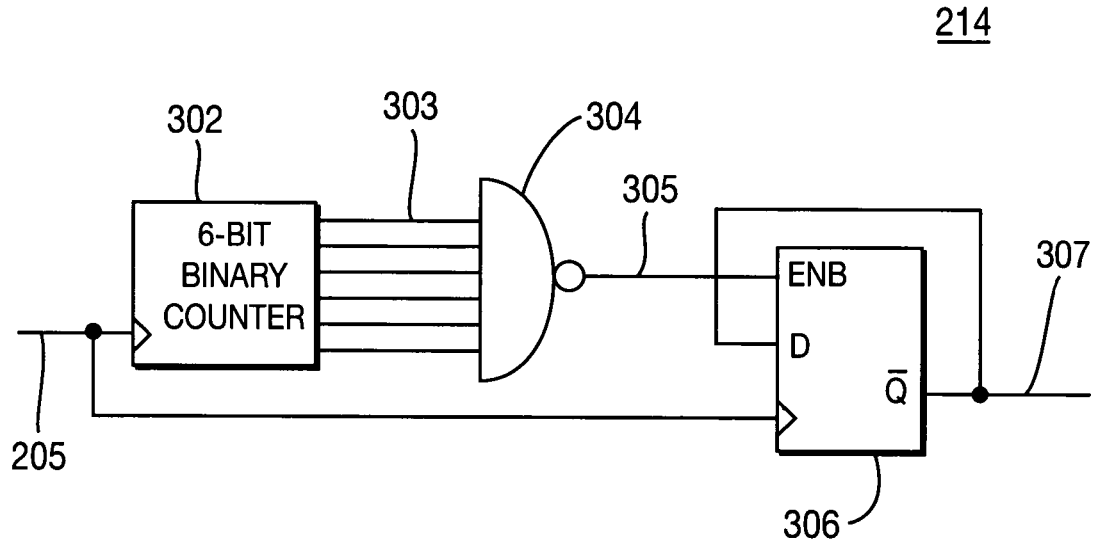
FIG. 3 is an exemplary rate matching unit used in the clock of FIG. 2.

FIG. 3 is an exemplary rate matching unit 214 for the fourth frequency divider 213 in FIG. 2. The rate matching unit 214 includes a 6-bit binary counter 302, a NAND gate 304 and a D flip-flop 306. The 6-bit binary counter 302 counts the LO signal 205 up to 64 and outputs a 6 bit binary number 303 to the NAND gate 304. The NAND gate 304 accepts the 6-bit binary number 303 and outputs '0' when the binary number 303 reaches 64, otherwise it outputs '1'. The output 305 of the NAND gate 304 enters an "enable" port of the D flip-flop 306. While the NAND gate output 305 is '1', the D flip-flop is enabled, but while the NAND gate output is '0', the D flip-flop is disabled. The LO signal 205 clocks the D flip-flop 306. The $\overline{Q}$ output of the D flip-flop 306 is fed back to the D input of the D flip-flop 306, and the $\overline{Q}$ output is output as the clock signal 307 for the UMTS timing manager 218. The D flip-flop output 307 is at half the input rate of the pulse train while the 64th pulse is disabled. Therefore, in this example, the output rate of the D flip-flop 306 is 153.6 MHz in average. The 153.6 MHz signal is then down-converted by the divider 216 by the factor of four to generate 38.4 MHz clock signal.

Additional frequency dividers may be implemented as required by other processors or modules. For example, the LO signal 205 (312 MHz) may be down-converted to 39 MHz, 78 MHz, 156 MHz or any other frequencies by frequency dividers 272, 274, 276.

In accordance with the present invention, both GSM and UMTS time-bases can be simultaneously maintained without having to reacquire time synchronization when switching modes. A single master-clock based ASIC is easier to construct than a multi-clock ASIC.

Although the features and elements of the present invention are described in the preferred embodiments in particular combinations, each feature or element can be used alone without the other features and elements of the preferred embodiments or in various combinations with or without other features and elements of the present invention.

What is claimed is:

1. A unified dual-mode global standard for mobile communication (GSM)/universal mobile telecommunication systems (UMTS) clock comprising:

a reference clock configured to generate a reference clock signal;

a local oscillator (LO) configured to generate a single LO signal based on the reference clock signal;

at least one frequency divider configured to selectively generate either (1) a GSM clock signal by converting a frequency of the LO signal by a predetermined integer factor or (2) a UMTS clock signal by converting the frequency of the LO signal by a predetermined integer factor, wherein both the GSM clock signal and the UMTS clock signal are generated based on the reference clock signal;

wherein the LO is configured to generate the LO signal at a frequency of 312 MHz and a frequency divider comprises a rate matching unit configured to convert the LO signal to a frequency that is an integer multiple of 3.84 MHz;

wherein the rate matching unit comprises:

a 6-bit counter configured to count pulses of the LO signal and to generate a 6-bit binary number;

a NAND gate configured to generate an output based on the 6-bit binary number; and a D flip-flop configured such that an enable port is driven by an output of the NAND gate, the LO signal clocks the D flip-flop and a $\overline{Q}$ output of the D flip-flop, which is used as a clock signal for a UMTS timing manager, is fed back to an input of the D flip-flop.

2. The dual-mode GSM/UMTS clock of claim 1 wherein the reference clock is configured to generate the reference clock signal having a frequency of one of 13 MHz, 15.36 MHz, 19.2 MHz, 26 MHz and 38.4 MHz.

3. The dual-mode GSM/UMTS clock of claim 1 wherein the at least one frequency divider comprises a first frequency divider configured to clock an analog-to-digital converter (ADC) and a second frequency divider configured to clock a digital-to-analog converter (DAC).

4. The dual-mode GSM/UMTS clock of claim 3 wherein the frequency divider further comprises a third frequency divider configured to generate a clock signal for a GSM timing manager.

5. The dual-mode GSM/UMTS clock of claim 3 wherein the frequency divider further comprises a fourth frequency divider configured to generate the clock signal for the UMTS timing manager.

6. The dual-mode GSM/UMTS clock of claim 1 wherein the LO is configured to generate the LO signal at a frequency of 312 MHz.

7. A dual-mode transceiver for global standard for mobile communication (GSM) and universal mobile telecommunication (UMTS), the transceiver comprising:

a unified dual-mode GSM/UMTS clock configured to generate a GSM clock signal and a UMTS clock signal based on a common reference clock signal;

a transmitter configured to process GSM baseband data and UMTS baseband data to be transmitted based on the GSM clock signal and the UMTS clock signal, respectively; and a receiver configured to process received GSM baseband data and UMTS baseband data based on the GSM clock signal and the UMTS clock signal, respectively, wherein the unified dual-mode GSM/UMTS clock comprises:

a reference clock configured to generate the common reference clock signal;

a local oscillator (LO) configured to generate a single LO signal based on the common reference clock signal; and at least one frequency divider configured to selectively generate either (1) the GSM clock signal by converting a frequency of the LO signal by a predetermined integer factor or (2) the UMTS clock signal by converting a the frequency of the LO signal by a predetermined integer factor;

wherein the LO is configured to generate the LO signal at a frequency of 312 MHz and the fourth frequency divider comprises:

a rate matching unit configured to convert the LO signal to a frequency that is integer multiple of 3.84 MHz; and a divider configured to divide an output of the rate matching unit by a second predetermined factor wherein the rate matching unit comprises:

a 6-bit counter configured to count pulses of the LO signal and to generate a 6-bit binary number;

a NAND gate configured to generate an output based on the 6-bit binary number; and a D flip-flop configured such that an enable port is driven by an output of the NAND gate, the LO signal clocks the D flip-flop and a $\overline{Q}$ output of the D flip-flop, which is used as the clock signal for the UMTS timing manager, is fed back to an input of the D flip-flop.

8. The dual-mode transceiver of claim 7, wherein the reference clock is configured to generate the common reference clock signal having a frequency of at least one of 13 MHz, 15.36 MHz, 19.2 MHz, 26 MHz and 38.4 MHz.

9. The dual-mode transceiver of claim 7, wherein the frequency divider comprises a first frequency divider configured to clock an analog-to-digital converter (ADC) in the receiver and a second frequency divider configured to clock a digital-to-analog converter (DAC) in the transmitter.

10. The dual-mode transceiver of claim 9 further comprising:

a GSM timing manager; and a third frequency divider configured to generate a clock signal for the GSM timing manager.

11. The dual-mode transceiver of claim 9 further comprising:

a UMTS timing manager; and a fourth frequency divider configured to generate a clock signal for the UMTS timing manager.

12. The dual-mode transceiver of claim 7, wherein the LO is configured to generate the LO signal at a frequency of 312 MHz.

13. The dual-mode transceiver of claim 7 further comprising an interpolator and a decimator configured to match frequencies of the UMTS baseband signal and the UMTS clock signal.

14. The dual-mode transceiver of claim 7 further comprising an interpolator and a decimator configured to match frequencies of GSM baseband signal and the GSM clock signal.

* * * * *